US012567472B2

(12) United States Patent
Guo

(10) Patent No.: US 12,567,472 B2
(45) Date of Patent: Mar. 3, 2026

(54) MEMORY DEVICE WITH BOUNDARY PAGE SEARCH RELATED TO INFORMATION RECOVERY

(71) Applicant: Yangtze Memory Technologies Co., Ltd., Wuhan (CN)

(72) Inventor: Lu Guo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 35 days.

(21) Appl. No.: 18/521,612

(22) Filed: Nov. 28, 2023

(65) Prior Publication Data

US 2024/0203514 A1     Jun. 20, 2024

(30) Foreign Application Priority Data

Dec. 20, 2022    (CN) .......................... 202211644196.9

(51) Int. Cl.
*G11C 16/34*          (2006.01)
*G11C 16/04*          (2006.01)
(52) U.S. Cl.
CPC ...... *G11C 16/3495* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 9,373,405 B2 * | 6/2016 | Ong ....................... | G11C 16/16 |
| 2015/0194220 A1 * | 7/2015 | Yang .................. | G11C 16/3436 |
| | | | 365/185.12 |
| 2019/0065361 A1 * | 2/2019 | Liao ....................... | G11C 16/10 |

* cited by examiner

*Primary Examiner* — Kretelia Graham
(74) *Attorney, Agent, or Firm* — Hanley, Flight & Zimmerman, LLC

(57) ABSTRACT

An example of the present disclosure provides a memory device including: a memory array and a peripheral circuit coupled with the memory array. The memory array includes memory blocks each including pages each including memory cells. The peripheral circuit includes a control logic configured to: receive the first information indicating to search the boundary page of the selected memory block in the memory blocks; the boundary page being related to the page requiring information recovery in the selected memory block; receive the address of the selected memory block; obtain the address of the boundary page in connection with the page erasing check function using the address of the selected memory block, the page erasing check function being configured to feed back whether memory cells in the page to be checked are all in the erased state.

20 Claims, 10 Drawing Sheets

300

| Output result (state bit) | Output result (page address) | Result analysis |
|---|---|---|
| 0xE1 | | Search failure |
| 0xE0 | 0x0000(namely the address of the first page of the selected memory block) | All pages of the selected memory block are in blank state |
| 0xE0 | The address of the current page to be checked: between 0x0000 and the address of the last page of the selected memory block | The current page to be checked is the boundary page |
| 0xE0 | The address of the last page of the selected memory block | All pages of the selected memory block are in non-blank state |

FIG. 8

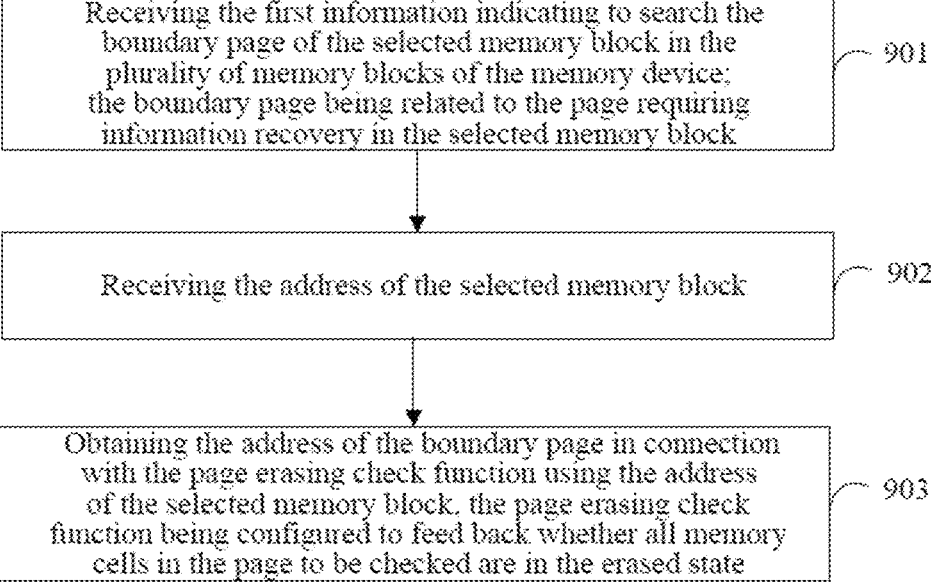

Receiving the first information indicating to search the boundary page of the selected memory block in the plurality of memory blocks of the memory device; the boundary page being related to the page requiring information recovery in the selected memory block    901

Receiving the address of the selected memory block    902

Obtaining the address of the boundary page in connection with the page erasing check function using the address of the selected memory block, the page erasing check function being configured to feed back whether all memory cells in the page to be checked are in the erased state    903

FIG. 10

MEMORY DEVICE WITH BOUNDARY PAGE SEARCH RELATED TO INFORMATION RECOVERY

REFERENCE TO RELATED APPLICATION

This application claims priority to and the benefit of Chinese Patent Application 202211644196.9, filed on Dec. 20, 2022, which is hereby incorporated by reference in its entirety.

TECHNICAL FIELD

Examples of the present disclosure relate to the field of semiconductor technology, for example, a memory device and an operating method thereof, as well as a memory system.

BACKGROUND

Memory devices are devices for saving information in modern information technology. As a typical non-volatile semiconductor memory, NAND (Not-And) flash memory has become the mainstream product in the memory market due to its high storage density, controllable production cost, suitable programing and erasing speeds and retention characteristics.

BRIEF DESCRIPTION OF ACCOMPANYING DRAWINGS

FIG. 8 is an analysis diagram of output results of a selected memory block according to an example of the present disclosure;

FIG. 10 is an implementation flow diagram of an operating method of a memory device according to an example of the present disclosure.

DETAILED DESCRIPTION

Figure 1:
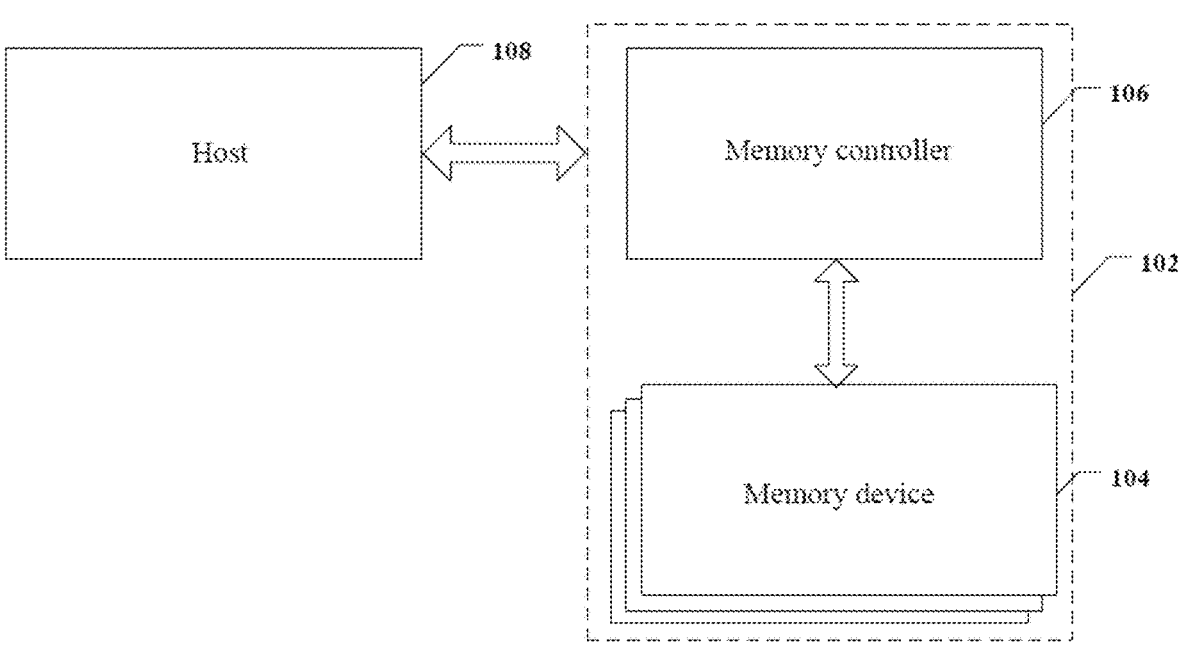
FIG. 1 is a diagram of an example system having a memory system according to an example of the present disclosure.

Example implementations of the present disclosure will be described in greater detail below with reference to the accompanying drawings. Although example implementations of the present disclosure are shown in drawings, it is to be appreciated that the present disclosure may be implemented in various forms rather than being limited to the specific implementations as set forth herein. In contrast, these implementations are provided to understand the present disclosure more thoroughly and convey the scope of the present disclosure completely to those skilled in the art.

In the following description, a large amount of specific details are presented to provide thorough understanding of the present disclosure. However, it is obvious to one skilled in the art that the present disclosure may be implemented without one or more of these details. In other examples, in order to avoid confusion with the present disclosure, some technical features well known in the art are not described. That is, not all features of the practical examples are described herein, and well known functions and structures are not described in detail.

In the accompanying drawings, sizes and relative sizes of layers, regions and elements may be exaggerated for purpose of clarity. The same reference numerals refer to the same elements throughout the specification.

It should be understood that while an element or a layer is said to be "on", "adjacent to", "connected to" or "coupled to" other elements or layers, it may be directly on, adjacent to, connected to or coupled to other elements or layers, or there may be intervening elements or layers. To the contrary, while an element is said to be "directly on", "directly adjacent to", "directly connected to" or "directly coupled to" other elements or layers, there is no intervening elements or layers. It is to be appreciated that although terms such as first, second, third etc. may be used to describe elements, components, regions, layers and/or parts, these elements, components, regions, layers and/or parts should not be limited by these terms. These terms are only used to differentiate one element, component, region, layer or part from another element, component, region, layer or part. Therefore, without departing from the teaching of the present disclosure, the first element, component, region, layer or part discussed below may represent the second element, component, region, layer or part. While discussing the second element, component, region, layer or part, it does not necessarily indicate there is the first element, component, region, layer or part in the present disclosure.

Spatial relationship terms such as "under", "below", "beneath", "over", "on" etc. may be used herein for convenient description to describe the relationship of one element or feature shown in the drawings relative to other elements or features. It is to be appreciated that spatial relationship terms are further intended to include different orientations of devices in use and operation in addition to orientations shown in the figures. For example, if the device in a figure is inverted, then an element or feature described as "under" or "below" or "beneath" another element or feature will be oriented as being "on" the other element or feature. Accordingly, example terms "under" and "below" may include two orientations, "on" and "under". A device may be otherwise oriented (rotated by 90 degrees or other orientations) and spatial description terms used herein should be interpreted accordingly.

Terms are used herein only for describing specific examples rather than limiting the present disclosure. As used herein, the singular form "a", "an" and "the" are also intended to include the plural form unless otherwise stated in the context. It is also understood that while used in the description, terms "consist" and/or "include" confirm the presence of the features, integers, steps, operations, elements and/or components, but do not exclude the presence or addition of one or more other features, integers, steps, operations, elements, components and/or groups. As used herein, the term "and/or" includes any and all combinations of relevant listed items.

In order to understand characteristics and technology contents of examples of the present disclosure in more detail, examples of the present disclosure will be described in detail with reference to the accompanying drawings that are only for the purpose of reference rather than limiting examples of the present disclosure.

The memory devices in examples of the present disclosure include, but are not limited to 3D NAND memories. 3D NAND memories will be described as examples to facilitate understanding.

FIG. 1 illustrates a block diagram of an exemplary system 100 having memory devices according to some aspects of the present disclosure. The system 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having memories therein. As shown in FIG. 1, system 100 may include a host 108 and a memory system 102 having one or more memory devices 104 and a memory controller 106. The host 108 can be a processor of an electronic device, such as a central processing unit (CPU), or a system-on-chip (SoC), such as an application processor (AP). The host 108 may be configured to send data to the memory device 104 or receive data from the memory device 104.

According to some implementations, the memory controller 106 is coupled to the memory device 104 and the host 108 and is configured to control the memory device 104. The memory controller 106 can manage the data stored in the memory device 104 and communicate with the host 108. In some implementations, the memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, the memory controller 106 is designed to operate in high duty cycle environment SSDs or embedded multimedia cards (eMMCs) that are used as e.g., data storages and enterprise memory arrays of the mobile devices such as smart phones, tablet computers and laptop computers.

The memory controller 106 can be configured to control operations of the memory device 104, such as read, erase, and program operations. The memory controller 106 can also be configured to manage various functions with respect to the data stored or to be stored in the memory device 104 including, but not limited to bad-block management, garbage collection, logical-to-physical address conversion, wear leveling, etc. In some implementations, the memory controller 106 is further configured to process error correction codes (ECCs) with respect to the data read from or written to the memory device 104. Any other suitable functions may be performed by the memory controller 106 as well, for example, formatting the memory device 104. The memory controller 106 can communicate with an external device (e.g., the host 108) according to a particular communication protocol. For example, the memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
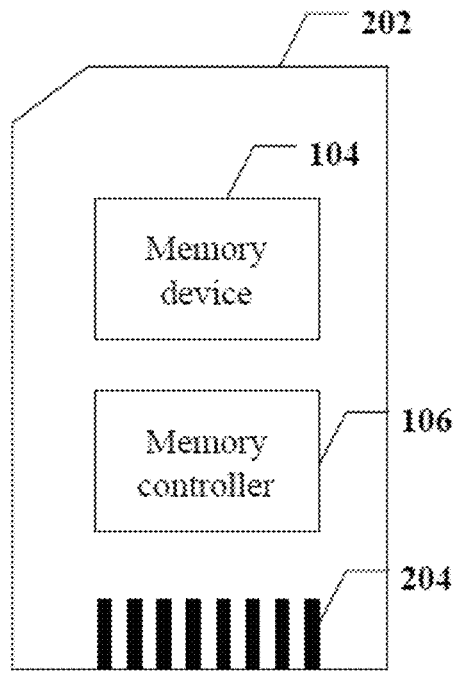
FIG. 2A is a diagram of an example memory card having a memory system according to an example of the present disclosure.
Figure 2B:
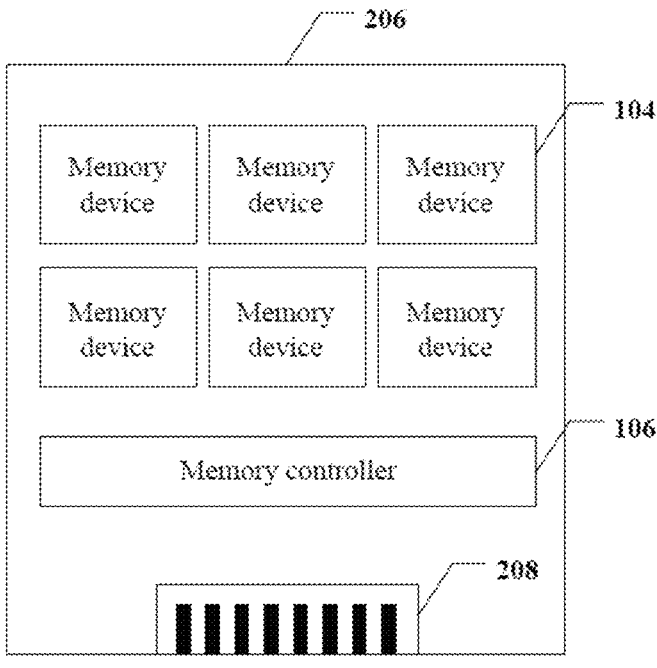
FIG. 2B is a diagram of an example solid state drive having a memory system according to an example of the present disclosure.

Memory controller 106 and one or more memory devices 104 can be integrated into various types of storage apparatuses, for example, be included in the same package, such as a universal Flash storage (UFS) package or an eMMC package. That is, the memory system 102 can be implemented and packaged into different types of end electronic products. In one example as shown in FIG. 2A, the memory controller 106 and a single memory device 104 can be integrated into a memory card 202. The memory card 202 may include a PC card (PCMCIA, Personal Computer Memory Card International Association), a CF card, a smart media (SM) card, a memory stick, a multimedia card (MMC, RS-MMC, MMCmicro), a SD card (SD, miniSD, microSD, SDHC), a UFS etc. The memory card 202 may also include a memory card connector 204 coupling the memory card 202 and the host (e.g., the host 108 in FIG. 1). In another example as shown in FIG. 2B, the memory controller 106 and the plurality of memory devices 104 may be integrated into an SSD 206. The SSD 206 may also include an SSD connector 208 coupling the SSD 206 and the host (e.g., the host 108 in FIG. 1). In some implementations, the memory capacity and/or operating speed of SSD 206 are greater than the memory capacity and/or operating speed of the memory card 202.

Figure 3A:
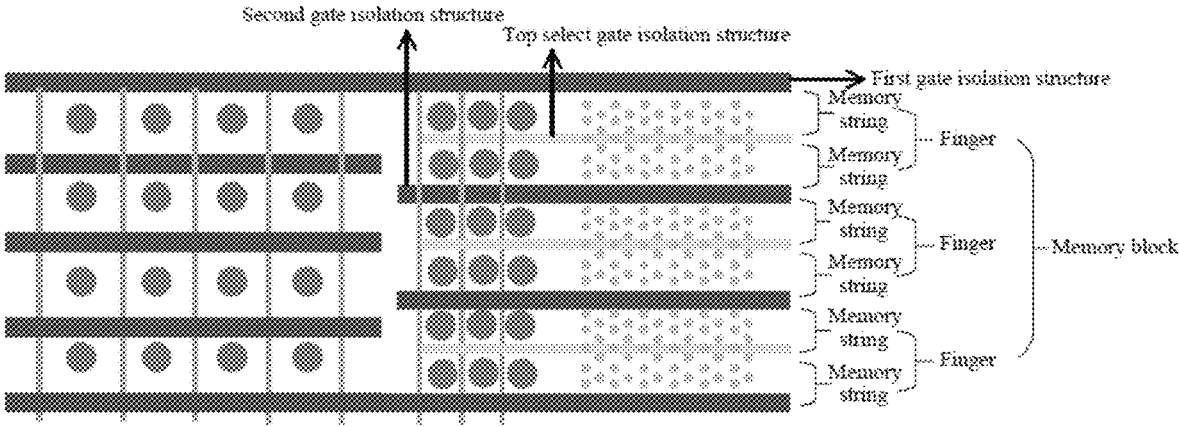
FIG. 3A is a diagram of the distribution of memory cells in a 3D NAND memory according to an example of the present disclosure.

FIG. 3A illustrates a structure diagram of a memory array of 3D NAND memories. As shown in FIG. 3A, the memory array of 3D NAND memories consists of several rows of memory cells staggered and parallel to gate isolation structures in which every two rows of memory cells are separated by a gate isolation structure and an top select gate isolation structure and each row of memory cells includes a plurality of memory cells. The gate isolation structures may include first gate isolation structures and second gate isolation structures. The first gate isolation structures divide the memory array into a plurality of memory blocks. A plurality of second gate isolation structures may divide a memory block into a plurality of fingers. An top select gate isolation structure disposed in the middle of each finger may divide the finger into two parts, thereby dividing the finger into two memory strings. The one memory block shown in FIG. 3A contains 6 memory strings. In practical applications, the number of memory strings in a memory block is not limited thereto. The memory cells in one memory block coupled with a certain word line may be referred to as a memory page or a page.

It is to be noted that the number of rows of memory cells between the gate isolation structures and the top select gate isolation structures shown in FIG. 3A is only an illustrative example, and not used for limiting the number of rows of memory cells contained in one finger of the 3D NAND memory in the present disclosure. In practical applications, the number of rows of memory cells contained in a finger may be adjusted according to practical conditions, such as 2, 4, 8, 16 etc.

Figure 3B:
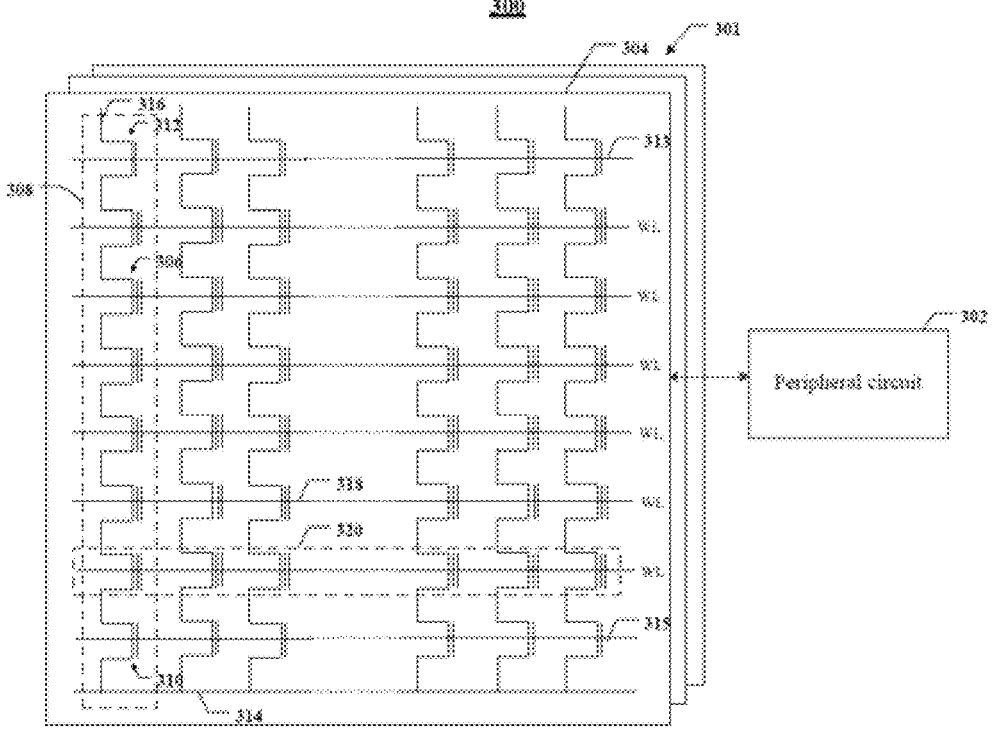
FIG. 3B is a diagram of an example memory device including peripheral circuits according to an example of the present disclosure.

FIG. 3B shows a schematic circuit diagram of example memory device 300 including a peripheral circuit according to some aspects of the present disclosure. The memory device 300 may be an example of the memory device 104 in FIG. 1. The memory device 300 may include a memory array 301 and a peripheral circuit 302 coupled to the memory array 301. A memory array 301 being a 3D NAND memory array will be described as an example in which the memory cells 306 are provided in form of an array of NAND memory strings 308 and each NAND memory string 308 extends vertically over the substrate (not shown). In some implementations, each NAND memory string 308 includes a plurality of memory cells 306 coupled in series and stacked vertically. Each memory cell 306 can remain continuous analog values, for example, voltages or charges, depending on the number of electrons trapped in the region of the memory cell 306. Each memory cell 306 may be a memory cell of a floating-gate type that includes floating-gate transistors or a memory cell of a charge trapping type that includes charge trapping transistors.

In some implementations, each memory cell 306 is a single-level cell (SLC) that has two possible memory states and can therefore store one bit of data. For example, the first memory state "0" may correspond to the first voltage range, and the second memory state "1" may correspond to the second voltage range. In some implementations, each memory cell 306 is a multi-level cell that can store more than one bits of data in more than four memory states. For example, an MLC (multi-level cell) may store two bits per cell, three bits per cell (also known as TLC, Trinary-Level Cell) or four bits per cell (also known as QLC (Quad-Level Cell)). Each MLC may be programmed to adopt a possible range of nominal storage values. In one example, if each MLC stores two bits of data, the MLC may be programmed to adopt one of the three possible programming levels from the erase state by writing one of the three possible nominal storage values into the cell. The fourth nominal storage value may be used for the erase state.

As shown in FIG. 3B, each NAND memory string 308 may include a bottom select gate (BSG) 310 at its source end and a top select gate (TSG) 312 at its drain end. BSG 310 and TSG 312 may be configured to activate selected NAND memory strings 308 during reading and programming operations. In some implementations, sources of the NAND memory strings 308 in the same memory block 304 are coupled together through the same source line (SL) 314 (e.g., the common SL). In other words, according to some implementations, all NAND memory strings 308 in the same memory block 304 have an array common source (ACS). According to some implementations, TSG 312 of each NAND memory string 308 is coupled to a corresponding bit line (BL) 316 and data may be read from or written into the bit line 316 via an output bus (not shown). In some implementations, each NAND memory string 308 is configured to be selected or deselected by applying a select voltage (for example higher than the threshold voltage of the transistor having TSG 312) or a deselect voltage (for example, 0V) to the corresponding TSG 312 via one or more TSG lines 313 and/or applying a select voltage (for example higher than the threshold voltage of the transistor having BSG 310) or a deselect voltage (for example, 0V) to the corresponding BSG 310 via one or more BSG lines 315.

As shown in FIG. 3B, the NAND memory string 308 may be organized into a plurality of memory blocks 304 and each memory block 304 may have a common source line 314. In some implementations, each memory block 304 is the basic data unit for erase operation. That is, all memory cells 306 on the same memory block 304 are erased at the same time. In order to erase the memory cells 306 in a selected memory block 304, it is possible to bias the source line 314 of the unselected memory blocks coupled to and in the same plane as the selected memory block 304 with an erase voltage (Vers) (for example, a high positive voltage such as 20V or higher). It will be appreciated that in some examples, it is possible to execute erase operation on the semi-block level, the quarter-block level or a level of any suitable number of memory blocks or any suitable fraction of a memory block. Memory cells 306 in adjacent NAND memory strings 308 may be coupled via the word line 318 that chooses which row of the memory cells 306 is subject to the reading and programming operations. In some implementations, each word line 318 is coupled to the page 320 of memory cells 306, which is the basic data unit for programming operation. The size of a page 320 in bits may be relevant to the number of NAND memory strings 308 in a memory block 304 that are coupled with the word line 318. Each word line 318 may include a plurality of control gates (gate electrodes) at each memory cell 306 in the respective page 320 and gate lines for coupling control gates. With reference to the previous FIG. 3A, a page 320 contains a plurality of memory cells 306 separated by top select gate isolation structures and gate isolation structures. A plurality of memory cell between a top select gate isolation structure and a gate isolation structure are arranged into a plurality of memory cell rows each of which is parallel to the gate isolation structure and the top select gate isolation structure. Memory cells in memory strings sharing the same word line form a programmable (read/write) page.

Figure 4:
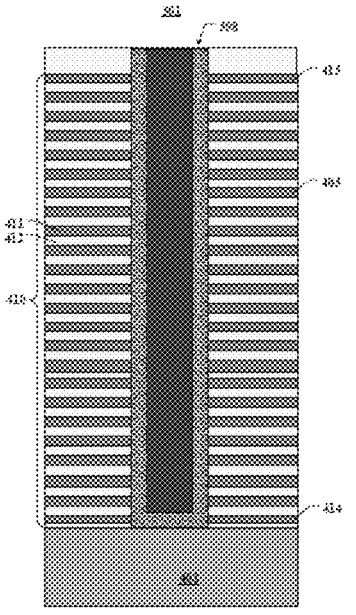
FIG. 4 is a sectional diagram of a memory array including NAND memory strings according to an example of the present disclosure.

FIG. 4 shows a sectional diagram of an example memory array 301 including NAND memory strings 308 according to some aspects of the present example. As shown in FIG. 4, a NAND memory string 308 may include a stack 410 including a plurality of gate layers 411 and a plurality of insulating layers 412 stacked alternatively and the memory string 308 penetrating the gate layers 411 and the insulating layers 412 vertically. The gate layers 411 and the insulating layers 412 may be stacked alternatively and adjacent two gate layers 411 are separated by an insulating layer 412. The number of the pairs of gate layers 411 and insulating layers 412 in the stack 410 may determine the number of the memory cells included in the memory array 301.

The constituent material of the gate layers 411 may include conductive materials. The conductive materials include, but are not limited to tungsten (W), cobalt (Co), copper (Cu), aluminum (Al), polysilicon, doped silicon, silicide or any combination thereof. In some implementations, each gate layer 411 includes a metal layer such as a tungsten layer. In some implementations, each gate layer 411 includes a doped polysilicon layer. Each gate layer 411 may include a control gate surrounding the memory cells. The gate layer 411 on top of the stack 410 may extend laterally as a top select gate line, the gate layer 411 at the bottom of the stack 410 may extend laterally as a bottom select gate line, and the gate layer 411 extending laterally between the top select gate line and the bottom select gate line may serve as a word line layer.

In some examples, the stack 410 may be disposed on the semiconductor layer 401. The semiconductor layer 401 may include silicon (e.g., single crystalline silicon), silicon germanium (SiGe), gallium arsenide (GaAs), germanium (Ge), silicon-on-insulator (SOI), germanium-on-insulator (GOI) or any other suitable material.

In some examples, the NAND memory string 308 includes a channel structure extends vertically through the stack 410. In some implementations, the channel structure includes a channel hole filled with (one or more) semiconductor materials (e.g., serving as the semiconductor channel) and (one or more) dielectric materials (e.g., serving as the memory film). In some implementations, the semiconductor channel includes silicon, such as polysilicon. In some implementations, the memory film is a composite dielectric layer including a tunneling layer, a storage layer (also known as "charge trapping/storage layer") and a barrier layer. The channel structure may have a cylindrical shape (e.g., a pillar shape). According to some implementations, the semiconductor channel, the tunneling layer, the storage layer and the barrier layer are arranged radially from the center of the pillar towards the outer surface in this order. The tunneling layer may include silicon oxide, silicon oxynitride or any combination thereof. The storage layer may include silicon nitride, silicon oxynitride or any combination thereof. The barrier layer may include silicon oxide, silicon oxynitride, high dielectric constant (high-k) dielectric or any combination thereof. In one example, the memory film may include a composite layer of silicon oxide/silicon oxynitride/silicon oxide (ONO).

Figure 5:
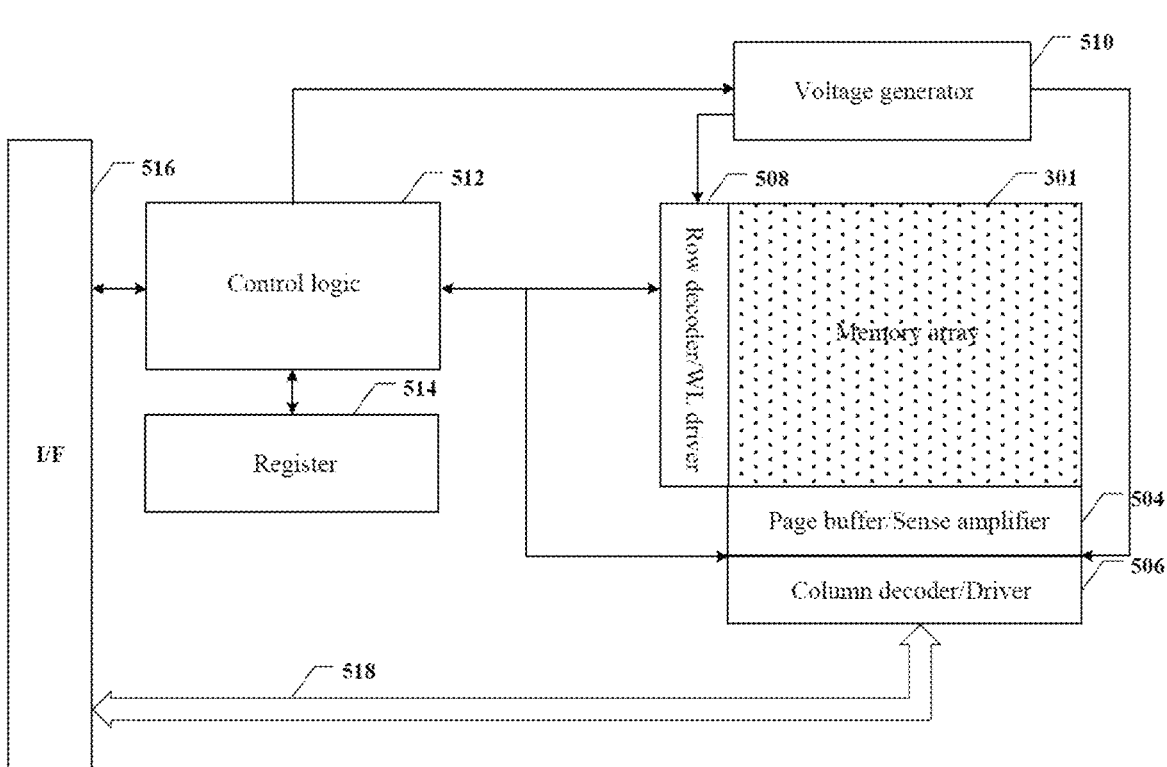
FIG. 5 is a diagram of an example memory device including a memory cell array and peripheral circuits according to an example of the present disclosure.

Referring back to FIG. 3B, the peripheral circuit 302 may be coupled to the memory array 301 through the bit line 316, the word line 318, the source line 314, the BSG line 315 and the TSG line 313. The peripheral circuit 302 may include any suitable analog, digital and hybrid signal circuits for facilitating operation of the memory array 301 by applying voltage signals and/or current signals to each target memory cell 306 via bit lines 316, word lines 318, source lines 314, BSG lines 315 and TSG lines 313 and sensing voltage signals and/or current signals from each target memory cell 306. The peripheral circuit 302 may include various types of peripheral circuits formed by metal-oxide-semiconductor (MOS) technology. As an example, FIG. 5 shows some example peripheral circuits. The peripheral circuit 302 includes a page buffer/sense amplifier 504, a column decoder/bit line driver 506, a row decoder/word line driver 508, a voltage generator 510, a control logic 512, a register 514, an interface 516 and a data bus 518. It should be understood that in some examples, additional peripheral circuits not shown in FIG. 5 may be further included.

The page buffer/sense amplifier 504 may be configured to read data from the memory array 301 and program (write) data to the memory array 301 according to control signals from control logic 512. In one example, the page buffer/sense amplifier 504 may store a page of programming data (writing data) to be programed into a page 320 of the memory array 301. In another example, the page buffer/sense amplifier 504 may execute the programming verification operation to ensure that the data has been properly programed into the memory cells 306 coupled to the selected word line 318. In yet another example, the page buffer/sense amplifier 504 may also sense a low-power signal from a bit line 316 indicating the data bit stored in a memory cell 306 and amplify the small voltage swing to an identifiable logic level in the read operation. The column decoder/bit line driver 506 may be configured to be controlled by the control logic 512 and select one or more NAND memory strings 308 by applying a bit line voltage generated by the voltage generator 510.

The row decoder/word line driver 508 may be configured to be controlled by the control logic 512, and select/deselected memory blocks 304 of the memory array 301 and select/deselect word lines 318 of the memory block 304. The row decoder/word line driver 508 may be further configured to drive word lines 318 using word line voltages generated by the voltage generator 510. In some implementations, the row decoder/word line driver 508 may also select/deselect and drive BSG lines 315 and TSG lines 313. As detailed in the following, the row decoder/word line driver 508 is configured to execute programming operation on the memory cells 306 coupled to the (one or more) selected word lines 318. The voltage generator 510 may be configured to be controlled by the control logic 512 and generate the word line voltage (for example, read voltage, program voltage, pass voltage, channel boost voltage, verification voltage, etc.), the bit line voltage and the source line voltage to be provided to the memory array 301.

The control logic 512 may be coupled to each peripheral circuit described above and configured to control operations of each peripheral circuit. The register 514 may be coupled to the control logic 512 and include a status register, a command register and an address register to store status information, command operation codes (OP) and command addresses for controlling operations of each of the peripheral circuits. The interface 516 may be coupled to the control logic 512, and serve as a control buffer to buffer control commands received from the host (not shown) and relay them to the control logic 512, and buffer status information received from the control logic 512 and relay them to the host. The interface 516 may be further coupled to the column decoder/bit line driver 506 via the data bus 518 and serve as a data I/O interface and a data buffer to buffer data and relay it to the memory array 301 or relay or buffer data from the memory array 301.

The basic unit in which the user accesses the memory system such as SSD 206 is referred to as a logical page. While inside the SSD 206, the memory controller 106 of the SSD 206 reads and writes the flash with flash pages as the basic unit, which are also known as physical pages or storage pages. For every logical page the user has written, the memory controller 106 of the SSD 206 would find a physical page for writing user data and such a mapping is recorded inside SSD at the same time. With such a mapping relationship, when the user needs to read a logical page next time, SSD knows where to read the data from the memory device.

A map table of address translation from a logical page to a physical page is maintained inside the SSD. For each logical page the user writes, a new mapping relationship would be generated, which will be added to (written for the first time) or change (overwrite) the map table. While reading a certain logical page, the SSD will first look for the physical page corresponding to the logical page in the map table, and then access the memory device to read corresponding user data. Due to the different sizes of a flash page and a logical page, the former generically being larger than the latter, in practice, it is not possible that one logical page corresponds to one physical page, but several logical pages correspond to one physical page.

Some SSDs 206 have dynamic random access memories (DRAMs) on board in the memory controllers 106, which mainly function to store the map tables. During operation of the SSD 206, all or most of the map tables may be placed on the DRAM so that the mapping relationship may be accessed quickly.

However, some entry-level SSDs 206 or mobile storage devices such as eMMCs and UFSs adopt DRAM-less designs due to the cost and power consumption considerations. Then, these entry-level SSDs 206 or mobile storage devices adopt the two-level mapping. The one-level map table in the two-level mapping is stored in a static random access memory (SRAM). A small part of the content of the two-level map table (L2P, logical address to physical address) is buffered in the SRAM, and most content is stored in the memory device 104.

For better firmware (FW) performance of the memory device 104, these entry-level SSDs 206 or mobile memory devices such as eMMCs and UFSs do not update the L2P tables to the specified memory blocks at any time, but update the L2P tables while the SSDs 206 or the mobile memory devices are idle or the memory satisfies certain capacity conditions such that the programming slowing may be addressed.

However, a risk of not updating L2P tables in time is that while the memory device 104 experiences accidental power down, the recent L2P table will be lost, and upon powering on again, the old L2P table will be loaded in the specified memory block of the memory device. Now, it is necessary to inquire the boundary page of the specified memory block and re-establish the L2P table according to the P2L information stored in the specified memory block. In view of this, the inquiry speed of the boundary page of the memory block influences the processing speed of accidental power down recovery. How to implement fast query of the boundary page of the memory block has the practical meaning.

Examples of the present disclosure provide a memory device including a memory array and a peripheral circuit coupled with the memory array, wherein the memory array includes a plurality of memory blocks each including a plurality of pages each including a plurality of memory cells; and the peripheral circuit includes a control logic that is configured to: receive the first information indicating to search the boundary page of the selected memory block in the plurality of memory blocks; the boundary page being related to the page requiring information recovery in the selected memory block; receive the address of the selected memory block; and obtain the address of the boundary page in connection with the page erasing check function using the address of the selected memory block, the page erasing check function being configured to feed back whether memory cells in the page to be checked are all in the erased state.

Herein, power down is classified into two types, one normal power down, another abnormal power down.

The so-called normal power down means before the power down, the host 108 will notify the memory system such as SSD 206 via commands and the SSD 206 will do the following things: (1) loading the user data buffered in the buffer into the memory device; (2) loading the map table into the memory device; (3) writing the block information of the memory device into the memory device (such as to which memory device the block being written belongs, and which location of the block of the memory device is to be written, blocks of which memory devices have been written, and blocks of which memory devices are invalid, etc.); and (4) writing other information of the SSD 206 into the memory device. The host 108 will stop powering the SSD really after the SSD 206 completes processing the above things. Based on this, normal power down will not cause data loss. Upon powering on again, the SSD 206 only needs to reload related information store before power down such as mapping data, block information of the memory device etc. and then can continue operation from the state before power down.

The so-called abnormal power down means that the SSD 206 is powered down without receiving the power-down notification from the host or the SSD fails to process the above-mentioned things and is powered down although it receives the power-down notification from the host.

In a general case, the SSD 206 writes the data buffered in SSD 206 (including the map table and the buffered user data) and state information relevant to the SSD 206 (such as the number of block write/erase of the memory device, the number of block read of the flash memory device, other information on the blocks of the memory device) into the memory device periodically, which is similar to the things to be executed by SSD before normal power down and is called as checkpoint.

Upon powering on again after abnormal power down, SSD 206 may read the recent checkpoint information from the memory device, but information after the recent checkpoint, the buffered data and the state information of the SSD 206 that has not been processed in time is not checked, namely not stored. Upon powering on again after abnormal power down, one of the main jobs of SSD 206 is to recover information on map tables after the recent checkpoint.

Upon powering on again after abnormal power down, while loading related information, the control logic will detect the SSD 206 is powered down abnormally. At this time, the control logic of the memory device receives the first information indicating to search the boundary page of the selected memory block in the plurality of memory blocks.

Figure 6:
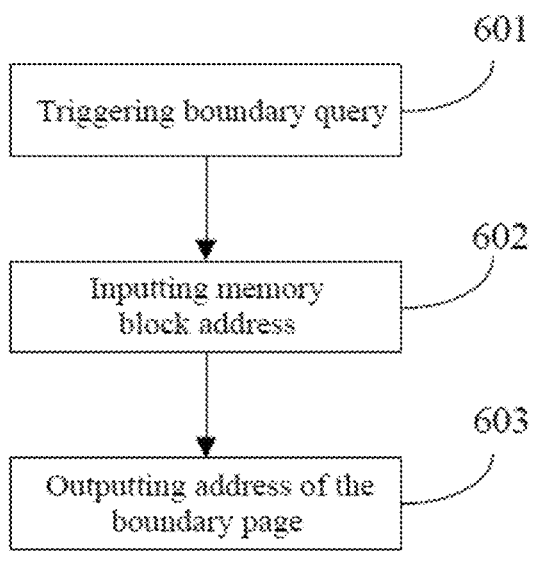
FIG. 6 is an implementation flow diagram for searching a boundary page of a selected memory block according to an example of the present disclosure.

FIG. 6 is an implementation flow diagram for searching a boundary page of a selected memory block according to an example of the present disclosure. In this example, upon powering on the memory device again after abnormal power down, it is determined that an abnormal power down recovery need to be performed by loading relevant information, namely searching the boundary page of the selected memory block in the plurality of memory blocks. Therefore 601 is executed to trigger the boundary query of the selected memory block. Then 602 is executed to obtain the input address of the selected memory block. Finally 603 is executed to obtain the address of the boundary page.

Herein, the selected memory block is any one of the plurality of memory blocks in the memory device. The selected memory block may be the memory block on which the memory device is operating upon abnormal power down and the address of the selected memory block may be the physical address of the selected memory block.

Herein, the boundary page is related to the page requiring information recovery in the selected memory block and the relevant information may be determined by the page state of the memory block.

It is to be noted that the information to be recovered as described herein may be any information that may be lost while the memory device in programming operation encounters abnormal power down, including, but not limited to the map table information. Only the map table information will be described below as an example.

While partial pages in the memory block are programmed, the boundary page may be the first page in which memory cells are all in the erased state occurring in the programming order in the selected memory block. Herein, the first page in which memory cells are all in the erased state may also be understood as the first blank page. It is to be understood that updating information such as map table into the pages of the memory block in the memory device is practically programming pages in the memory block, while writing of pages in the memory block is implemented according to a certain programming order such as sequential or reversed programming. Herein, the sequential programming may be understood as programming from the page coupled with the word line close to the BSG 310 in FIG. 3B row by row until the page coupled with the word line close to the TSG 312; and the reversed programming may be understood as programming from the page coupled with the word line close to the TSG 312 in FIG. 3B row by row until the page coupled with the word line close to the BSG 310.

Illustratively, upon abnormal power down, information such as the map table being updated will be lost from the boundary page and information such as map tables of the previous pages has all been updated in this programming order. Based on this, it is necessary to re-establish the L2P table according to the corresponding information of the physical addresses and logical addresses stored in pages arranged in the programming order from the boundary page.

While all pages in the memory block are not programmed, the boundary page may also be the first page in the programming order of the selected memory block. Now, the memory cells in all pages of the selected memory block are in the erased state. Illustratively, upon abnormal power down, information such as map table of the pages of the memory block has not started to be updated yet, and after powering on again, the L2P table needs to be re-established according to the corresponding information of the physical addresses and logical addresses stored in the page from the first page in the selected memory block in the programming order.

While all pages in the memory block are programmed, the boundary page may also be the last page in the programming order of the selected memory block. Now, the memory cells in all pages of the selected memory block are not in the erased state. Illustratively, upon abnormal power down, information such as map table in the pages of the memory block is all updated, and after powering on again, the L2P table needs not to be re-established according to the corresponding information of the physical addresses and logical addresses stored in the page in the memory block, and it is possible to start updating from the next memory block.

Next, it is necessary to search the boundary page in the selected memory block. The address of the boundary page is obtained in connection with the page erasing check function using the address of the selected memory block.

Herein, the page erasing check function may implement searching on page level for feeding back whether memory cells in the page to be checked are all in the erased state. It is understood that when the page erasing check function checks out that memory cells in the page are all in erased state, it means that map tables corresponding to the page have not started to be updated yet and it is necessary to recover the map tables corresponding to the page upon powering on again; and when the page erasing check function checks out that memory cells in the page are not all in erased state, it means that map tables corresponding to the page have been updated and it is not necessary to recover the map tables corresponding to the page upon powering on again.

In some examples, the control logic is configured to: set the value of the cyclic count to the initial value when receiving the first information; set the address of the first page to be checked and the address of the last page to be checked using the address of the selected memory block; determine the address of the current page to be checked based on the address of the first page to be checked and the address of the last page to be checked; determine the first result of the current page to be checked with the page erasing check function; update the address of the first page to be checked or the address of the last page to be checked according to the first result and then update the value of the cyclic count; compare the updated value of the cyclic count and a preset value to obtain a second result, the preset value being related to the total number of pages contained in the selected memory block; and determine the address of the boundary page according to the second result.

Figure 7:
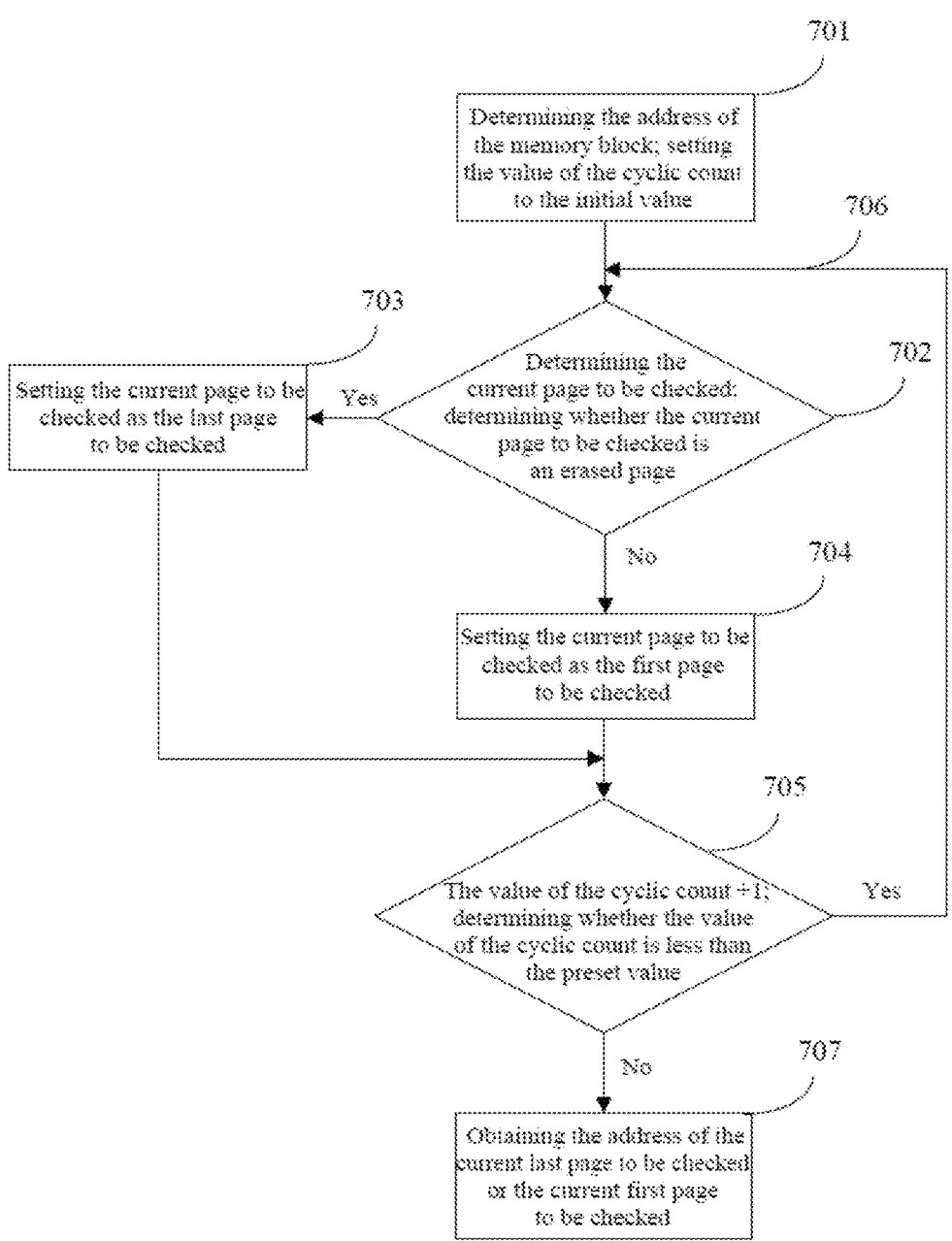
FIG. 7 is an implementation flow diagram for searching a boundary page of a selected memory block according to another example of the present disclosure.

FIG. 7 is an implementation flow diagram for searching a boundary page of a selected memory block according to an example of the present disclosure. Detailed description will be presented below with reference to FIG. 7. 701 is executed to set the value of the cyclic count to the initial value that may be 0. The value of the cyclic count will be updated, for example, accumulated again and again in the subsequent query process.

Before executing 702, it is necessary to set the address of the first page to be checked and the address of the last page to be checked. Herein, the address of the first page to be checked and the address of the last page to be checked may both be values updated again and again. In some examples, the setting the address of the first page to be checked and the address of the last page to be checked using the address of the selected memory block may be setting the initial value of the address of the first page to be checked and the initial value of the address of the last page to be checked in connection with the programming order of the memory pages using the address of the selected memory block. Illustratively, after the address of the selected memory block is obtained, the address of first page (close to TSG) of the selected memory block and the address of the last page (close to BSG) may both be obtained. If the afore-mentioned sequential programming (from TSG to BSG direction), it is possible to set the address of the first page of the selected memory block as the initial value of the address of the first page to be checked, and set the address of the last page of the selected memory block as the initial value of the address of the last page to be checked. If the afore-mentioned reversed programming (from BSG to TSG direction), it is possible to set the address of the last page of the selected memory block as the initial value of the address of the first page to be checked, and set the address of the first page of the selected memory block as the initial value of the address of the last page to be checked.

702 is executed to select the current page to be checked and determine the address of the current page to be checked. Herein, the address of the current page to be checked is a value updated again and again. The current page to be checked is determined based on the address of the first page to be checked and the address of the last page to be checked and there may be multiple ways to determine the address of the current page to be checked.

In some examples, the control logic is configured to: determine the address of the current page to be checked based on the address of the first page to be checked and the address of the last page to be checked in connection with the bisection method.

Herein, when determining the current page to be checked with the bisection method, the determined current page to be checked has the address of the exactly middle page between the address of the first page to be checked and the address of the last page to be checked. It is to be noted that when the intermediate value is calculated for the address of the first page to be checked and the address of the last page to be checked, if the sum of the address of the first page to be checked and the address of the last page to be checked can not be divided evenly by 2, the quotient may be kept while the remainder is discarded. Illustratively, the address of the first page to be checked is 1, the address of the last page to be checked is 14, then the address of the middle page may be 7.

After selecting the address of the current page to be checked, it is determined next whether the current page to be checked is an erased page, that is, determine whether the memory cells in the current page to be checked are all in the erased state with the page erasing check function. Illustratively, it is determined herein whether the memory cells in the page with address 7 are all in erased state. If the memory cells in the page with address 7 are all in erased state, the page with address 7 is an erased page. If the memory cells in the page with address 7 are not all in erased state, the page with address 7 is not an erased page, and the page with address 7 may also be said not an blank page.

Herein, the result of determining whether the current page to be checked is an erased page is the first result.

Next, the address of the first page to be checked or the address of the last page to be checked is updated according to the first result and then the value of the cyclic count is updated.

In some examples, the control logic is configured to: update the address of the last page to be checked to the address of the current page to be checked when the first result indicates that memory cells in the current page to be checked are all in erased state; and update the address of the first page to be checked to the address of the current page to be checked when the first result indicates that memory cells in the current page to be checked are not all in erased state.

Herein, as an example, it is assumed that each memory block has 14 pages, then there are three cases: memory block I: memory cells in all pages in the memory block are all in erased state; memory block II: memory cells in pages with addresses 1-10 in the memory block are not all in erased state, and memory cells in pages with addresses 11-14 are all in erased state; memory block III: memory cells in all pages of the memory block are not all in erased state. The example doesn't indicate the examples of the present application are limited thereto.

Herein, with reference to FIG. 7, when the first result indicates that the current page to be checked is an erased page, that is, the memory cells in the current page to be checked are all in erased state, and illustratively, the page with address 7 is the current page to be checked, in the memory block I, the current page to be checked is an erased page, then 703 is executed to update the address of the last page to be checked to the address of the current page to be checked, that is, update the address of the last page to be checked to 7; when the first result indicates that the current page to be checked is not an erased page, that is, the memory cells in the current page to be checked are not all in erased state, and illustratively, the page with address 7 is the current page to be checked, in the memory block II and the memory block III, the current page to be checked is not an erased page, then 704 is executed to update the address of the first page to be checked to the address of the current page to be checked, that is, update the address of the first page to be checked to 7.

It is appreciated that when the first result indicates that the current page to be checked is an erased page, namely memory cells in the current page to be checked are all in erased state, it implies that the current page to be checked is either an blank page that appears first in which case the current page to be checked is the boundary page or a certain one among a plurality of blank pages that appear successively in which case the first blank page needs to be found backward as the boundary page such that the address of the last page to be checked is updated to the address of the current page to be checked. When the first result indicates that the current page to be checked is not an erased page, it implies that the current page to be checked is a certain one among a plurality of programmed pages that appear successively in which case the first blank page needs to be found forward as the boundary page such that the address of the first page to be checked is updated to the address of the current page to be checked.

It is further appreciated that since the address of the first page to be checked and the address of the last page to be checked are updated continuously, it is possible to determine the updated address of the current page to be checked based on the updated address of the first page to be checked and the updated address of the last page to be checked, thereby facilitating searching the boundary page quickly.

It is to be noted that after both 703 and 704, 705 needs to be executed to update the value of the cyclic count and compare the value of the cyclic count and the preset value. Before comparison, the preset value with which the updated value of the cyclic count is compared needs to be further set. It is appreciated that the difference between the preset value and the initial value reflects the number of queries and the preset value is related to the total number of pages contained in the selected memory block. Illustratively, while using the bisection method, the preset value may be the integer of log $2n+1$, wherein n is the total number of pages (physical pages) contained in the selected memory block.

In 705, each time after verifying the current page to be checked as determined by the first page to be checked and the last page to be checked, the value of the cyclic count stored in the register will be updated, for example, incremented by 1. Illustratively, for the memory blocks of the afore-mentioned three cases, the value of the cyclic count is now updated from 0 to 1, and the preset value is log $214+1$, i.e., 4.

Then the updated value of the cyclic count is compared with the preset value to obtain a second result. It is determined whether it is necessary to continue determining the current page to be checked and determining the result of the current page to be checked according to the obtained second result.

In some examples, the control logic is configured to: when the second result indicates the updated value of the cyclic count is greater than or equal to the preset value, the address of the current last page to be checked or the address of the current first page to be checked is determined as the address of the boundary page; and when the second result indicates that the updated value of the cyclic count is smaller than the preset value, updating the value of the cyclic count is executed, and then the most recent updated value of the cyclic count is compared with the preset value and it is determined whether to continue executing the updating value of the cyclic count according to the comparison result, until the value of the recent value of the cyclic count is greater than or equal to the preset value.

Wherein, the updating the value of the cyclic count includes: re-determining the new address of the current page to be checked according to the updated address of the first page to be checked and the address of the last page to be checked; and continuing to update the address of the first page to be checked or the address of the last page to be checked according to the first result of the new address of the current page to be checked and accumulating the updated value of the cyclic count subsequently.

Herein, with reference to FIG. 7, when the second result indicates the updated value of the cyclic count is greater than or equal to the preset value, 707 is executed with the address of the current last page to be checked or the address of the current first page to be checked as the address of the boundary page. When the second result indicates the updated value of the cyclic count is less than the preset value, 706 is executed which would repeat 702, 703/704,

705 for one or more times to implement continuous updating of the cyclic count, finally obtaining a value of the cyclic count greater than or equal to the preset value to merge to 707.

Illustratively, it is herein possible to continue analyzing the execution of memory blocks of the afore-mentioned three cases.

Memory block I (memory cells in all pages in the memory block are in erased state): now the value of the cyclic count is 1 and the preset value is 4. The second result indicates that the updated value of the cyclic count is less than the preset value, 702 is executed: since the address of the first page to be checked is 1 and the address of the last page to be checked is 7, the address of the current page to be checked is 4, and the memory cells in the page with page address 10 are all in erased state. 703 is executed: setting the address of the last page to be checked to 4. 705 is executed: updating the value of the cyclic count as 2 and comparing the value of the cyclic count and the preset value. Now, 702 is executed again: since the address of the first page to be checked is 1, the address of the last page to be checked is 4, the address of the current page to be checked is 2, and memory cells in the page with the page address 2 are all in erased state. 703 is executed: setting the address of the last page to be checked to 2. 705 is executed: updating the value of the cyclic count to 3 and comparing the value of the cyclic count and the preset value. Now, 702 is executed again: since the address of the first page to be checked is 1, the address of the last page to be checked is 2, the address of the current page to be checked is 1, and memory cells in the page with the page address 2 are all in erased state. 703 is executed: setting the address of the last page to be checked to 1. 705 is executed: updating the value of the cyclic count to 4 and comparing the value of the cyclic count and the preset value. Now the value of the cyclic count is greater than or equal to the preset value, and 706 will not be executed. When the second result indicates the updated value of the cyclic count is greater than or equal to the preset value, 707 is executed with the address of the current last page to be checked or the address of the current first page to be checked as the address of the boundary page. At this time, both the address of the last page to be checked and the address of the first page to be checked are 1, that is, the address of the boundary page is 1, memory cells in all pages of the memory block I are in erased state and recovery should also start to be implemented from the page with address 1.

Memory block II (memory cells in pages with addresses 1-10 in the memory block are not all in erased state, memory cells in pages with addresses 11-14 are all in erased state): now the value of the cyclic count is 1 and the preset value is 4. The second result indicates that the updated value of the cyclic count is less than the preset value, 702 is executed: since the address of the first page to be checked is 7 and the address of the last page to be checked is 14, the address of the current page to be checked is 10, and the memory cells in the page with page address 10 are not all in erased state. 704 is executed: setting the address of the first page to be checked to 10. 705 is executed: updating the value of the cyclic count as 2 and comparing the value of the cyclic count and the preset value. Now, 702 is executed again: since the address of the first page to be checked is 10, the address of the last page to be checked is 14, the address of the current page to be checked is 12, and memory cells in the page with the page address 12 are all in erased state. 703 is executed: setting the address of the last page to be checked to 12. 705 is executed: updating the value of the cyclic count to 3 and comparing the value of the cyclic count and the preset value.

Now, 702 is executed again: since the address of the first page to be checked is 10, the address of the last page to be checked is 12, the address of the current page to be checked is 11, and memory cells in the page with the page address 12 are all in erased state. 703 is executed: setting the address of the last page to be checked to 11. 705 is executed: updating the value of the cyclic count to 4 and comparing the value of the cyclic count and the preset value. Now the value of the cyclic count is greater than or equal to the preset value, 706 will not be executed. When the second result indicates the updated value of the cyclic count is greater than or equal to the preset value, 707 is executed with the address of the current last page to be checked or the address of the current first page to be checked as the address of the boundary page. At this time, the address of the last page to be checked is 11, that is, the address of the boundary page is 11, memory cells in pages with addresses 1-10 of the memory block II are not all in erased state, memory cells in pages with addresses 11-14 are all in erased state, and recovery should also start to be implemented from the page with address 11.

Memory block III (memory cells in all pages in the memory block are not all in erased state): now the value of the cyclic count is 1 and the preset value is 4. The second result indicates that the updated value of the cyclic count is less than the preset value. 702 is executed: since the address of the first page to be checked is 7 and the address of the last page to be checked is 14, the address of the current page to be checked is 10, and the memory cells in the page with page address 10 are not all in erased state. 704 is executed: setting the address of the first page to be checked to 10. 705 is executed: updating the value of the cyclic count as 2 and comparing the value of the cyclic count and the preset value. Now, 702 is executed again: since the address of the first page to be checked is 10, the address of the last page to be checked is 14, the address of the current page to be checked is 12, and memory cells in the page with the page address 12 are not all in erased state. 704 is executed: setting the address of the first page to be checked to 12. 705 is executed: updating the value of the cyclic count to 3 and comparing the value of the cyclic count and the preset value. Now, 702 is executed again: since the address of the first page to be checked is 12, the address of the last page to be checked is 14, the address of the current page to be checked is 13, and memory cells in the page with the page address 13 are not all in erased state. 704 is executed: setting the address of the first page to be checked to 13. 705 is executed: updating the value of the cyclic count to 4 and comparing the value of the cyclic count and the preset value. Now the value of the cyclic count is greater than or equal to the preset value, 706 will not be executed. When the second result indicates the updated value of the cyclic count is greater than or equal to the preset value, 707 is executed with the address of the current last page to be checked or the address of the current first page to be checked as the address of the boundary page. At this time, the address of the first page to be checked is 13, the address of the last page to be checked is 14, the address of the last page to be checked is used as the boundary address, that is, the address of the boundary page is 14 and memory cells in all pages in memory block III are not all in erased state. Although the boundary address is also obtained, the boundary address may indicate that pages in memory block III do not need recovery.

That is, when the value of the cyclic count is greater than or equal to the preset value, there may occur two cases for the address of the current first page to be checked and the address of the last page to be checked. In the first case, the address of the current first page to be checked and the address of the current last page to be checked coincide with each other. In the second case, the address of the current first page to be checked and the address of the current last page to be checked are two adjacent addresses arranged in order. For both cases, finally the address of the first page to be checked or the address of the last page to be checked is used as the address of the boundary page. Therefore, it is necessary to verify the states of memory cells in the first page to be checked and the last page to be checked to determine the final boundary page.

In some examples, the control logic is configured to: when the second result indicates the updated value of the cyclic count is greater than or equal to the preset value, verify states of memory cells in the current first page to be checked and the current last page to be checked; if memory cells in pages in one of the current first page to be checked and the current last page to be checked are in programmed state and memory cells in remaining pages are in erased state, or memory cells in the current first page to be checked and the current last page to be checked are all in programmed state, use the address of the current last page to be checked as the address of the boundary page; and if memory cells in the current first page to be checked and the current last page to be checked are all in erased state, use the address of the current first page to be checked as the address of the boundary page.

It is appreciated that in order to obtain the address of the boundary page, the control logic will further verify the memory cells in related pages that are the current first page to be checked and the current last page to be checked.

If memory cells in pages in one of the current first page to be checked and the current last page to be checked are in programmed state and memory cells in remaining pages are in erased state, it indicates the blank page is located at the middle page of the memory block, that is, the blank page is not located at the first page or the last page of the memory block. In this case, the last page to be checked will necessarily be updated until the current last page to be checked is the blank page that appears first in the memory block.

If memory cells in the current first page to be checked and the current last page to be checked are all in programmed state, which indicates that all pages in the selected memory block are not blank page, now the address of the current last page to be checked should be used as the address of the boundary page but the map table corresponding to pages in the memory block needs not to be recovered.

If memory cells in the current first page to be checked and the current last page to be checked are all in erased state, which indicates that all pages in the selected memory block are blank pages, now the address of the current first page to be checked should be used as the address of the boundary page and the map tables corresponding to all pages in the memory block need to be recovered.

It is appreciated that the control logic will also obtain the related state result that the boundary page has been successfully checked while obtaining the address of the boundary page, referring to FIG. 8 as an example, which is an analysis diagram of the output result of the selected memory block in an example of the present disclosure. As shown in FIG. 8, when 0xE1 is output with respect to the state result, which indicates search failure of the state of the selected memory block. This condition may occur in case that an abnormal event happens in the search process, e.g., returning no result while determining states of memory cells in a certain page in the search process. When 0xE0 is output with respect to the state result, which indicates search success of the state of the selected memory block. Specifically, when the output address is the address of the first page of the memory block, it indicates memory cells in all pages in the memory block are in erased state, and information such as map tables dumped in the memory block needs to be re-updated. When the output address is between the address of the first page of the memory block and the address of the last page, it indicates the boundary page in the memory block is a middle page in the memory block, and now it is necessary to update information of the boundary page and pages thereafter according to the programming order. When the output address is the address of the last page and memory cells in the last page are not all in erased state, it indicates the boundary page of the memory block is the last page of the memory block and all pages of the memory block have updated data and need not update information such as map tables of the memory block although the boundary page is the last page now.

It is to be noted that in the above description, the programming of pages under programming has been completed upon the abnormal power down. When sudden power down occurs during the programming of a certain page and causes the programming process of the page not to be completed, for example, when memory cells of the page correspond to a plurality of programming states and the programming proceeds in a manner of one state after another state, and the page is not in its final state but in an intermediate state upon power down, one approach to handle this is to discard this page directly and re-program contents of the page on the page next to this page.

In order to improve the accuracy, it is also possible to verify the obtained boundary page after obtaining the address of the boundary page. In some examples, the control logic is configured to: verify the boundary page after obtaining the address of the boundary page. The verification of the boundary page including: when the boundary page is a page other than the first page and the last page in the selected memory block, determining whether memory cells in the previous page of the boundary page are all in programmed state and whether memory cells in the next page of the boundary page are all in erased state; if memory cells in the previous page of the boundary page are all in programmed state and memory cells in the next page of the boundary page are all in erased state, the verification result being pass; and if memory cells in the previous page of the boundary page are not all in programmed state and/or memory cells in the next page of the boundary page are not all in erased state, the verification result being fail.

Figure 9:
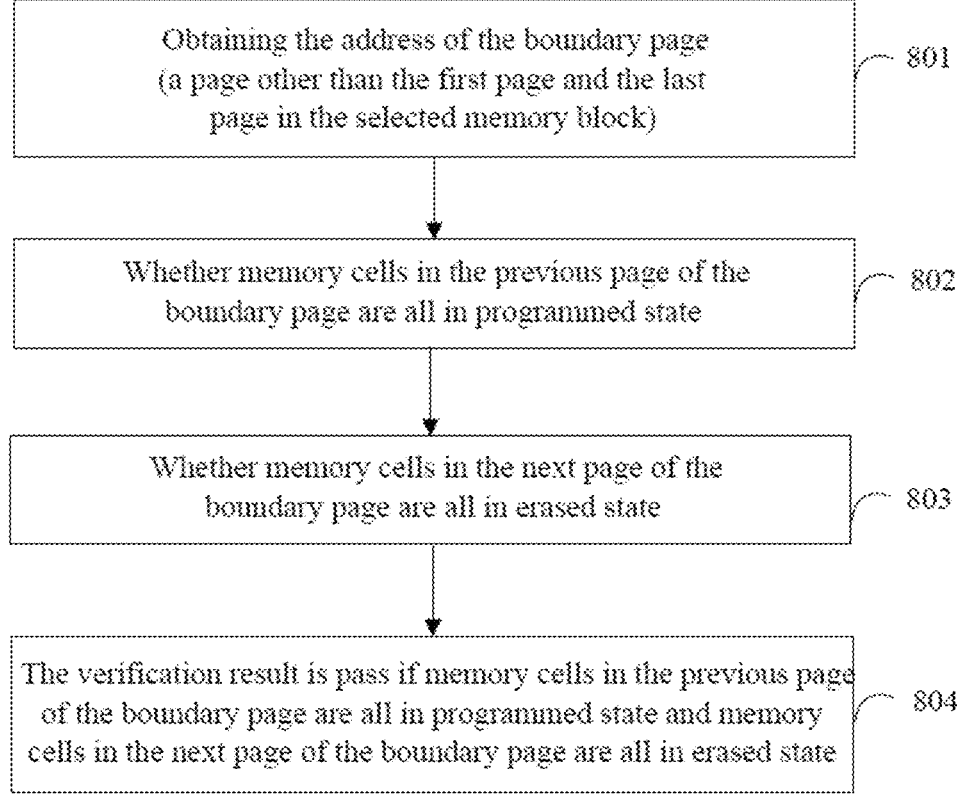
FIG. 9 is a verification diagram of a boundary page according to an example of the present disclosure.

As shown in FIG. 9, 801 is executed to obtain the address of the boundary page that is a page other than the first page and the last page in the selected memory block. Next, 802 and 803 are executed to determine whether memory cells in the previous page of the boundary page are all in programmed state and whether memory cells in the next page of the boundary page are all in erased state. Finally, 804 is executed to obtain a conclusion according to the result of 802 and 803.

Here, now that the boundary page and the address thereof have been obtained, it is easy to obtain the previous page and the next page of the boundary page that are arranged in the programming order.

It is appreciated that if the recovery of map tables needs to start from the boundary page, the boundary page must satisfy the condition that memory cells in the previous page thereof in programming order are all in programmed state and memory cells in the next page thereof are all in erased state with the verification result being pass. If memory cells in the previous page of the boundary page are not all in programmed state and/or memory cells in the next page thereof are not all in erased state, in other words, the programming of the previous page of the boundary page is interrupted without completion, which indicates the map tables should be recovered from the previous page rather than from the obtained boundary page and/or the map table of the previous page of the boundary page is not lost, in which case the map tables should not either be recovered from the obtained boundary page with the conclusion that the verification result being fail.

What has been discussed above is the verification in case that the obtained boundary page is an intermediate page of the memory block. However, the boundary page may also be verified in case that the obtained boundary page might be the first page or the last page of the memory block. In some examples, the control logic is configured to: when the boundary page is the first page in the selected memory block, determine whether memory cells in the next page of the boundary page are all in erased state; if memory cells in the next page of the boundary page are all in erased state, the verification result being pass; and if memory cells in the next page of the boundary page are not all in erased state, the verification result being fail; and when the boundary page is the last page in the selected memory block, determine whether memory cells in the previous page of the boundary page are all in programmed state; if memory cells in the previous page of the boundary page are all in programmed state, the verification result being pass; and if memory cells in the previous page of the boundary page are not all in programmed state, the verification result being fail.

It should be appreciated that when the obtained boundary page is the first page of the memory block, there is no previous page for the first page in the programming order, so verification is not needed for the previous page of the first page, and when the obtained boundary page is the last page of the memory block, there is no next page for the last page in the programming order, so verification is not needed for the next page of the last page.

The above-described method for determining boundary page is the bisection method. In practical applications, the traversing method may be used to determine the example boundary page. In some examples, when it is also needed to determine the current page to be checked with the traversing method, the determined current page to be checked is any one page successive in order (from the first page) or reverse order (from the last page) between the address of the first page to be checked and the address of the last page to be checked. The first result is obtained by combining the current page to be checked with the page erasing check function. When the first result indicates the current page to be checked is an erased page, the current page to be checked is the boundary page. When the first result indicates the current page to be checked is not an erased page, the next page of the current page to be checked arranged in the order and not verified yet is verified until a page of which the first result indicating the current page to be checked is an erased page occurs for the first time, which page is the boundary page.

The above-mentioned method implements the function of determining the boundary page easily with a simple implementation.

The time taken to determine the boundary page with the bisection method is constant. In some examples, the memory device includes a 3D NAND memory.

The memory devices in examples of the present disclosure are not limited to 3D NAND memories. In examples of the present disclosure, the memory device may be a semiconductor memory including, but not limited to a 3D NAND flash memory, a vertical NAND flash memory, a NOR flash memory, a dynamic random access memory (DRAM), a ferroelectric random access memory (FRAM), a magnetoresistive random access memory (MRAM), a phase change random access memory (PCRAM), a resistive random access memory (PRAM) or a nano random access memory (NRAM) etc.

In examples of the present disclosure, there is provided a rapid and effective method for scanning overall state of a memory block. Specifically, searching of the boundary page on the memory block level is implemented by packaging the page erasing check function on the memory device page level, that is, the control logic can output the boundary page in the selected memory block directly by simply receiving the address of the selected memory block and implementing calculations. As such, on the one hand, interactions between the memory device and the memory controller are reduced, thereby reducing the interaction time and decoding time to the largest extent, which in turn reduces the time for query and finally reduces the recovery time after accidental power down.

An example of the present disclosure further provides a memory system including: one or more memory devices as described in any one of the above-described examples; and a memory controller coupled with the memory device and controlling the memory device.

An example of the present disclosure further provides a memory system in which the memory controller is configured to: receive the first information indicating to search the boundary page of the selected memory block in the plurality of memory blocks; the boundary page being related to the page requiring information recovery in the selected memory block; receive the address of the selected memory block; and obtain the address of the boundary page in connection with the page erasing check function using the address of the selected memory block, the page erasing check function being configured to feed back whether memory cells in the page to be checked are all in the erased state.

It is appreciated that the afore-mentioned operations such as receiving the first information is configured in the control logic. In addition, operations such as receiving the first information may also be configured in the memory controller.

Upon powering on again after abnormal power down, while loading related information, the memory controller will detect the SSD 206 is powered down abnormally. At this time, the memory controller will receive the first information indicating to search the boundary page of the selected memory block in the plurality of memory blocks; and receive the address of the selected memory block and search the boundary page of the selected memory block in the plurality of memory blocks according to these information. In other words, the implementation subject herein may be either the control logic or the memory controller.

Here, relevant structures and compositions of the memory system 102 in FIGS. 1, 2A and 2B may be referred to for the specific structure and composition of the memory system. It will not be repeated for conciseness.

In some examples, the memory system includes a memory card or a solid state disk.

Based on the aforementioned memory device, an example of the present disclosure further provides an operating method for the memory device as shown in FIG. 10, including as follows.

901: receiving the first information indicating to search the boundary page of the selected memory block in the plurality of memory blocks of a memory device; the boundary page being related to the page requiring information recovery in the selected memory block.

902: receiving the address of the selected memory block.

903: obtaining the address of the boundary page in connection with the page erasing check function using the address of the selected memory block, the page erasing check function being configured to feed back whether memory cells in the page to be checked are all in the erased state.

Herein, the implementation subject of blocks 901 to 903 may be the control logic in the peripheral circuit in the memory device.

In some examples, obtaining the address of the boundary page in connection with the page erasing check function using the address of the selected memory block, including: receiving the value of the cyclic count to the initial value when receiving the first information; setting the address of the first page to be checked and the address of the last page to be checked using the address of the selected memory block; determining the address of the current page to be checked based on the address of the first page to be checked and the address of the last page to be checked; determining the first result of the current page to be checked with the page erasing check function; updating the address of the first page to be checked or the address of the last page to be checked according to the first result and then updating the value of the cyclic count; comparing the updated value of the cyclic count and a preset value to obtain a second result, the preset value being related to the total number of pages contained in the selected memory block; and determining the address of the boundary page according to the second result.

In some examples, updating the address of the first page to be checked or the address of the last page to be checked according to the first result includes: updating the address of the last page to be checked to the address of the current page to be checked when the first result indicates that memory cells in the current page to be checked are all in erased state; and updating the address of the first page to be checked to the address of the current page to be checked when the first result indicates that memory cells in the current page to be checked are not all in erased state.

In some examples, the determining the address of the boundary page according to the second result includes: when the second result indicates the updated value of the cyclic count is greater than or equal to the preset value, determining the address of the current last page to be checked or the address of the current first page to be checked as the address of the boundary page; and when the second result indicates that the updated value of the cyclic count is smaller than the preset value, executing updating the value of the cyclic count, and then comparing the re-updated value of the cyclic count with the preset value and determining whether to continue executing a new updating value of the cyclic count according to the comparison result, until the value of the recent value of the cyclic count is greater than or equal to the preset value; wherein the updating the value of the cyclic count includes: re-determining the new address of the current page to be checked according to the updated address of the first page to be checked and the address of the last page to be checked; and continuing to update the address of the first page to be checked or the address of the last page to be checked according to the first result of the new address of the current page to be checked and continuing to update the value of the cyclic count subsequently.

In some examples, the determining the address of the boundary page according to the second result further includes: when the second result indicates the updated value of the cyclic count is greater than or equal to the preset value, verifying states of memory cells in the current first page to be checked and the current last page to be checked; if memory cells in pages in one of the current first page to be checked and the current last page to be checked are in programmed state and memory cells in remaining pages are in erased state, or memory cells in the current first page to be checked and the current last page to be checked are all in programmed state, using the address of the current last page to be checked as the address of the boundary page; and if memory cells in the current first page to be checked and the current last page to be checked are all in erased state, using the address of the current first page to be checked as the address of the boundary page.

In some examples, the determining the address of the current page to be checked based on the address of the first page to be checked and the address of the last page to be checked includes: determining the address of the current page to be checked based on the address of the first page to be checked and the address of the last page to be checked in connection with the bisection method; the total number of the pages contained in the selected memory block being n, the initial value of the cyclic count being 0, the preset value being the integer part of log 2n+1, and n being a positive integer greater than 1.

In some examples, the method further includes: verifying the boundary page after obtaining the address of the boundary page. The verification of the boundary page includes: when the boundary page is a page other than the first page and the last page in the selected memory block, determining whether memory cells in the previous page of the boundary page are all in programmed state and whether memory cells in the next page of the boundary page are all in erased state; if memory cells in the previous page of the boundary page are all in programmed state and memory cells in the next page of the boundary page are all in erased state, the verification result being pass; and if memory cells in the previous page of the boundary page are not all in programmed state and memory cells in the next page of the boundary page are not all in erased state, the verification result being failure.

In some examples, the verifying the boundary page further includes: when the boundary page is the first page in the selected memory block, determining whether memory cells in the next page of the boundary page are all in erased state; if memory cells in the next page of the boundary page are all in erased state, the verification result being pass; and if memory cells in the next page of the boundary page are not all in erased state, the verification result being fail; and when the boundary page is the last page in the selected memory block, determining whether memory cells in the previous page of the boundary page are all in programmed state; if memory cells in the previous page of the boundary page are all in programmed state, the verification result being pass; and if memory cells in the previous page of the boundary page are not all in programmed state, the verification result being fail.

An example of the present disclosure provides a memory device and an operating method thereof, and a memory system. The memory device includes: a memory array and a peripheral circuit coupled with the memory array, wherein the memory array includes a plurality of memory blocks each including a plurality of pages each including a plurality of memory cells, the peripheral circuit includes a control logic configured to: determine it is needed to search the boundary page of a selected memory block in the plurality of memory blocks; the boundary page including the page in which memory cells are all in erased state that occurs first in the programming order of the selected memory block; receive the address of the selected memory block; and obtain and output the address of the boundary page in connection with the page erasing check function using the address of the selected memory block, the page erasing check function being configured to feed back whether the page to be checked is an erased page. In examples of the present disclosure, there is provided a rapid and effective method for scanning overall state of a memory block.

Specifically, searching of the boundary page on the memory block level is implemented by packaging the page erasing check function on the memory device page level, that is, the control logic can output the boundary page in the selected memory block directly by simply receiving the address of the selected memory block and implementing calculations. As such, on the one hand, interactions between the memory device and the memory controller are reduced, thereby reducing the interaction time and decoding time to the largest extent, which in turn reduces the time for query and finally reduces the recovery time after accidental power down; on the other hand, the method can adapt to different platforms and strategies in the memory system, for example, can be compatible with the multi-plane mode and the asynchronous multi-plane independent (AMPI) mode and have a good compatibility with the half block erase (HBE) mode.

Examples of the present disclosure provide a memory device and an operating method thereof, as well as a memory system.

In the first aspect, an example of the present disclosure provides a memory device including a memory array and a peripheral circuit coupled with the memory array, wherein the memory array includes a plurality of memory blocks each comprising a plurality of pages each comprising a plurality of memory cells; and the peripheral circuit comprises a control logic that is configured to: receive the first information indicating to search the boundary page of the selected memory block in the plurality of memory blocks; the boundary page being related to the page requiring information recovery in the selected memory block; receive the address of the selected memory block; and obtain the address of the boundary page in connection with the page erasing check function using the address of the selected memory block, the page erasing check function being configured to feed back whether memory cells in the page to be checked are all in the erased state.

In the above solution, the control logic is configured to: set a value of a cyclic count to an initial value when receiving the first information; set an address of a first page to be checked and an address of a last page to be checked using an address of a selected memory block; determine an address of a current page to be checked based on the address of the first page to be checked and the address of the last page to be checked; determine a first result of the current page to be checked with a page erasing check function; update the address of the first page to be checked or the address of the last page to be checked according to the first result and then update the value of the cyclic count; compare the updated value of the cyclic count and a preset value to obtain a second result, the preset value being related to a total number of pages contained in the selected memory block; and determine an address of the boundary page according to the second result.

In the above solution, the control logic is configured to: update the address of the last page to be checked to the address of the current page to be checked when the first result indicates that memory cells in the current page to be checked are all in erased state; and update the address of the first page to be checked to the address of the current page to be checked when the first result indicates that memory cells in the current page to be checked are not all in erased state.

In the above solution, the control logic is configured to: when the second result indicates the updated value of the cyclic count is greater than or equal to the preset value, determine the address of the current last page to be checked or the address of the current first page to be checked as the address of the boundary page; when the second result indicates that the updated value of the cyclic count is smaller than the preset value, execute the updating the value of the cyclic count, and then compare the re-updated value of the cyclic count with the preset value and determine whether to continue executing a new updating of the value of the cyclic count according to the comparison result, until the value of the recent value of the cyclic count is greater than or equal to the preset value; wherein the updating the value of the cyclic count comprises: re-determining a new address of the current page to be checked according to the updated address of the first page to be checked and the address of the last page to be checked; and continuing to update the address of the first page to be checked or the address of the last page to be checked according to the first result of the new address of the current page to be checked and continuing to update the value of the cyclic count subsequently.

In the above solution, the control logic is configured to: when the second result indicates the updated value of the cyclic count is greater than or equal to the preset value, verify states of memory cells in the current first page to be checked and the current last page to be checked; if memory cells in pages in one of the current first page to be checked and the current last page to be checked are in programmed state and memory cells in remaining pages are in erased state, or memory cells in the current first page to be checked and the current last page to be checked are all in programmed state, using the address of the current last page to be checked as the address of the boundary page; and if memory cells in the current first page to be checked and the current last page to be checked are all in erased state, use the address of the current first page to be checked as the address of the boundary page.

In the above solution, the control logic is configured to: determine the address of the current page to be checked based on the address of the first page to be checked and the address of the last page to be checked in connection with a bisection method; wherein a total number of the pages contained in the selected memory block is n, the initial value of the cyclic count is 0, the preset value is an integer part of log 2n+1, and n is a positive integer greater than 1.

In the above solution, the control logic is configured to: verify the boundary page after obtaining the address of the boundary page; wherein verifying the boundary page comprises: when the boundary page is a page other than the first page and the last page in the selected memory block, determining whether memory cells in the previous page of the boundary page are all in programmed state and whether memory cells in the next page of the boundary page are all in erased state; if memory cells in the previous page of the boundary page are all in programmed state and memory cells in the next page of the boundary page are all in erased state, the verification result being pass; and if memory cells in the previous page of the boundary page are not all in programmed state and/or memory cells in the next page of the boundary page are not all in erased state, the verification result being fail.

In the above solution, the control logic is configured to: when the boundary page is the first page in the selected memory block, determine whether memory cells in a next page of the boundary page are all in erased state; if memory cells in the next page of the boundary page are all in erased state, the verification result being pass; and if memory cells in the next page of the boundary page are not all in erased state, the verification result being fail; and when the boundary page is the last page in the selected memory block, determine whether memory cells in the previous page of the boundary page are all in programmed state; if memory cells in the previous page of the boundary page are all in programmed state, the verification being pass; and if memory cells in the previous page of the boundary page are not all in programmed state, the verification being fail.

In the above solution, the memory device includes a three-dimensional NAND (3D NAND) memory.

In the second aspect, an example of the present disclosure provides a memory system including: one or more of any of the above-mentioned memory devices; and a memory controller coupled with the memory device and controlling the memory device.

In the third aspect, an example of the present disclosure provides a memory system comprising a memory device and a memory controller coupled with and controlling the memory device; wherein the memory controller is configured to: receive the first information indicating to search the boundary page of the selected memory block in the plurality of memory blocks; the boundary page being related to the page requiring information recovery in the selected memory block; receive the address of the selected memory block; and obtain the address of the boundary page in connection with the page erasing check function using the address of the selected memory block, the page erasing check function being configured to feed back whether memory cells in the page to be checked are all in the erased state.

In the fourth aspect, an example of the present disclosure provides an operating method of a memory device, including: receiving the first information indicating to search the boundary page of the selected memory block in the plurality of memory blocks of the memory device; the boundary page being related to the page requiring information recovery in the selected memory block; receiving the address of the selected memory block; and obtaining the address of the boundary page in connection with the page erasing check function using the address of the selected memory block, the page erasing check function being configured to feed back whether memory cells in the page to be checked are all in the erased state.

In the above solution, obtaining the address of the boundary page in connection with the page erasing check function using the address of the selected memory block comprises: setting a value of a cyclic count to an initial value when receiving the first information;

setting an address of a first page to be checked and an address of a last page to be checked using an address of a selected memory block;

determining an address of a current page to be checked based on the address of the first page to be checked and the address of the last page to be checked; determining a first result of the current page to be checked with a page erasing check function; updating the address of the first page to be checked or the address of the last page to be checked according to the first result and then updating the value of the cyclic count; comparing the updated value of the cyclic count and a preset value to obtain a second result, the preset value being related to a total number of pages contained in the selected memory block; and determining an address of the boundary page according to the second result.

In the above solution, updating the address of the first page to be checked or the address of the last page to be checked according to the first result includes: updating the address of the last page to be checked to the address of the current page to be checked when the first result indicates that memory cells in the current page to be checked are all in erased state; and updating the address of the first page to be checked to the address of the current page to be checked when the first result indicates that memory cells in the current page to be checked are not all in erased state.

In the above solution, the determining the address of the boundary page according to the second result comprises: when the second result indicates the updated value of the cyclic count is greater than or equal to the preset value, determining the address of the current last page to be checked or the address of the current first page to be checked as the address of the boundary page; when the second result indicates that the updated value of the cyclic count is smaller than the preset value, executing the updating the value of the cyclic count, and then comparing the re-updated value of the cyclic count with the preset value and determining whether to continue executing a new updating of the value of the cyclic count according to the comparison result, until the value of the recent value of the cyclic count is greater than or equal to the preset value; wherein the updating the value of the cyclic count comprises: re-determining a new address of the current page to be checked according to the updated address of the first page to be checked and/or the address of the last page to be checked; and continuing to update the address of the first page to be checked or the address of the last page to be checked according to the first result of the new address of the current page to be checked and continuing to update the value of the cyclic count subsequently.

In the above solution, the determining the address of the boundary page according to the second result further includes: when the second result indicates the updated value of the cyclic count is greater than or equal to the preset value, verifying states of memory cells in the current first page to be checked and the current last page to be checked; if memory cells in pages in one of the current first page to be checked and the current last page to be checked are in programmed state and memory cells in remaining pages are in erased state, or memory cells in the current first page to be checked and the current last page to be checked are all in programmed state, using the address of the current last page to be checked as the address of the boundary page; and if memory cells in the current first page to be checked and the current last page to be checked are all in erased state, using the address of the current first page to be checked as the address of the boundary page.

In the above solution, the determining the address of the current page to be checked based on the address of the first page to be checked and the address of the last page to be checked includes: determining the address of the current page to be checked based on the address of the first page to be checked and the address of the last page to be checked in connection with a bisection method; wherein a total number of the pages contained in the selected memory block is n, the initial value of the cyclic count is 0, the preset value is an integer part of $\log 2n+1$, and n is a positive integer greater than 1.

In the above solution, the method further includes: verifying the boundary page after obtaining the address of the boundary page; wherein verifying the boundary page comprises: when the boundary page is a page other than the first page and the last page in the selected memory block, determining whether memory cells in the previous page of the boundary page are all in programmed state and whether memory cells in the next page of the boundary page are all in erased state; if memory cells in the previous page of the boundary page are all in programmed state and memory cells in the next page of the boundary page are all in erased state, the verification result being pass; and if memory cells in the previous page of the boundary page are not all in programmed state and/or memory cells in the next page of the boundary page are not all in erased state, the verification result being failure.

In the above solution, the verifying the boundary page further includes: when the boundary page is the first page in the selected memory block, determining whether memory cells in a next page of the boundary page are all in erased state; if memory cells in the next page of the boundary page are all in erased state, the verification result being pass; and if memory cells in the next page of the boundary page are not all in erased state, the verification result being fail; and when the boundary page is the last page in the selected memory block, determining whether memory cells in the previous page of the boundary page are all in programmed state; if memory cells in the previous page of the boundary page are all in programmed state, the verification result being pass; and if memory cells in the previous page of the boundary page are not all in programmed state, the verification result being fail.

An example of the present disclosure provides a memory device and an operating method thereof, and a memory system. The memory device includes: a memory array and a peripheral circuit coupled with the memory array, wherein the memory array includes a plurality of memory blocks each including a plurality of pages each including a plurality of memory cells, the peripheral circuit includes a control logic configured to: determine it is needed to search the boundary page of a selected memory block in the plurality of memory blocks; the boundary page including the page in which memory cells are all in erased state that occurs first in the programming order of the selected memory block; receive the address of the selected memory block; and obtain and output the address of the boundary page in connection with the page erasing check function using the address of the selected memory block, the page erasing check function being configured to feed back whether the page to be checked is an erased page. In examples of the present disclosure, there is provided a rapid and effective method for scanning overall state of a memory block.

Specifically, searching of the boundary page on the memory block level is implemented by packaging the page erasing check function on the memory device page level, that is, the control logic can output the boundary page in the selected memory block directly by simply receiving the address of the selected memory block and implementing calculations. As such, on the one hand, interactions between the memory device and the memory controller are reduced, thereby reducing the interaction time and decoding time to the largest extent, which in turn reduces the time for query and finally reduces the recovery time after accidental power down.

It should be understood that "one example" or "an example" as mentioned throughout the description means that particular features, structures, or characteristics related to the example are included in at least one example of the present disclosure. Therefore, "in one example" or "in an example" occurring throughout the description does not necessarily refer to the same example. In addition, these particular features, structures, or characteristics may be incorporated in one or more examples in any suitable manners. It should be understood that in various examples of the present disclosure, the sequence numbers of the above-described processes do not mean the sequential order of executions. The execution order of the processes should be determined by their functions and internal logics and should not limit the implementation process of the examples of the present disclosure. The sequence numbers of the above-described examples of the present disclosure are only for the purpose of description rather than representing strengths and weaknesses of examples.

The methods disclosed in the method examples provided in the present disclosure may be combined in any manner without conflicts to obtain new method examples.

What has been described above are only implementations of the present disclosure. However, the protection scope of the present disclosure is not limited thereto, and variations or substitutions that easily occur to one skilled in the art in the technical scope disclosed in the present disclosure should all be encompassed in the protection scope of the present disclosure. Therefore, the protection scope of the present disclosure should be determined by the protection scope of the claims.

What is claimed is:

1. A memory device comprising:

a memory array including memory blocks, wherein each memory block of the memory blocks comprises pages each comprising memory cells;

a peripheral circuit coupled with the memory array and comprising a control logic that is configured to:

receive a first information indicating to search a boundary page of a selected memory block in the memory blocks, the boundary page being related to a page requiring information recovery in the selected memory block;

receive an address of the selected memory block;

obtain an address of the boundary page in connection with a page erasing check function using the address of the selected memory block, the page erasing check function being configured to feed back whether memory cells in a page to be checked are all in an erased state; and verify the boundary page after obtaining the address of the boundary page, wherein verifying the boundary page comprises:

when the boundary page is a page other than a first page and a last page in the selected memory block, determining whether memory cells in a previous page of the boundary page are all in a programmed state and whether memory cells in a next page of the boundary page are all in the erased state;

if the memory cells in the previous page of the boundary page are all in the programmed state and the memory cells in the next page of the boundary page are all in the erased state, a verification result being pass; and if the memory cells in the previous page of the boundary page are not all in the programmed state or the memory cells in the next page of the boundary page are not all in the erased state, the verification result being fail.

2. The memory device of claim 1, wherein to obtain the address of the boundary page in connection with the page erasing check function using the address of the selected memory block, the control logic is configured to:

set a value of a cyclic count to an initial value when receiving the first information;

set an address of the first page to be checked and an address of the last page to be checked using the address of the selected memory block;

determine an address of a current page to be checked based on the address of the first page to be checked and the address of the last page to be checked;

determine a first result of the current page to be checked with the page erasing check function;

update the address of the first page to be checked or the address of the last page to be checked according to the first result and then update the value of the cyclic count;

compare the updated value of the cyclic count with a preset value to obtain a second result, the preset value being related to a total number of pages contained in the selected memory block; and determine the address of the boundary page according to the second result.

3. The memory device of claim 2, wherein to update the address of the first page to be checked or the address of the last page to be checked according to the first result the control logic is configured to:

update the address of the last page to be checked to the address of the current page to be checked when the first result indicates that memory cells in the current page to be checked are all in the erased state; and update the address of the first page to be checked to the address of the current page to be checked when the first result indicates that the memory cells in the current page to be checked are not all in the erased state.

4. The memory device of claim 3, wherein to determine the address of the boundary page, the control logic is configured to:

when the second result indicates the updated value of the cyclic count is greater than or equal to the preset value, determine an address of a current last page to be checked or an address of a current first page to be checked as the address of the boundary page; and when the second result indicates that the updated value of the cyclic count is smaller than the preset value, execute the updating of the updated value of the cyclic count, and then compare the updated value of the cyclic count with the preset value and determine whether to continue executing a new updating of the value of the cyclic count according to a result of the comparison, until a recent value of the cyclic count is greater than or equal to the preset value, wherein the updating the value of the cyclic count comprises:

re-determining a new address of the current page to be checked according to an updated address of the first page to be checked and an updated address of the last page to be checked; and continuing to update the updated address of the first page to be checked or the updated address of the last page to be checked according to the first result of a new address of the current page to be checked and continuing to update the value of the cyclic count subsequently.

5. The memory device of claim 4, wherein to determine the address of the boundary page according to the second result the control logic is configured to:

when the second result indicates the updated value of the cyclic count is greater than or equal to the preset value, verify states of memory cells in the current first page to be checked and the current last page to be checked;

if memory cells in pages in one of the current first page to be checked and the current last page to be checked are in the programmed state and memory cells in remaining pages are in the erased state, or memory cells in the current first page to be checked and the current last page to be checked are all in the programmed state, use the address of the current last page to be checked as the address of the boundary page; and if memory cells in the current first page to be checked and the current last page to be checked are all in the erased state, use the address of the current first page to be checked as the address of the boundary page.

6. The memory device of claim 2, wherein, to determine the address of the current page to be checked based on the address of the first page to be checked and the address of the last page to be checked, the control logic is configured to determine the address of the current page to be checked based on the address of the first page to be checked and the address of the last page to be checked in connection with a bisection method, wherein the total number of the pages contained in the selected memory block is n, the initial value of the cyclic count is 0, the preset value is an integer part of $\log_2 n + 1$, and n is a positive integer greater than 1.

7. The memory device of claim 1, wherein the control logic is configured to:

when the boundary page is the first page in the selected memory block, determine whether memory cells in the next page of the boundary page are all in the erased state, wherein determining whether the memory cells in the next page of the boundary page are all in the erased state further comprises:

if the memory cells in the next page of the boundary page are all in the erased state, the verification result being pass; and if the memory cells in the next page of the boundary page are not all in the erased state, the verification result being fail; and when the boundary page is the last page in the selected memory block, determine whether memory cells in the previous page of the boundary page are all in the programmed state, wherein determining whether the memory cells in the previous page of the boundary page are all in the programmed state further comprises:

if the memory cells in the previous page of the boundary page are all in the programmed state, the verification result being pass; and if the memory cells in the previous page of the boundary page are not all in the programmed state, the verification result being fail.

8. The memory device of claim 1, wherein the memory device comprises a 3D NAND memory.

9. A memory system comprising:

at least one memory device configured to:

receive a first information indicating to search a boundary page of a selected memory block in a plurality of memory blocks, the boundary page being related to a page requiring information recovery in the selected memory block;

receive an address of the selected memory block;

obtain an address of the boundary page in connection with a page erasing check function using the address of the selected memory block, the page erasing check function being configured to feed back whether memory cells in a page to be checked are all in an erased state; and verify the boundary page after obtaining the address of the boundary page, wherein verifying the boundary page comprises:

when the boundary page is a page other than a first page and a last page in the selected memory block, determining whether memory cells in a previous page of the boundary page are all in a programmed state and whether memory cells in a next page of the boundary page are all in the erased state;

if the memory cells in the previous page of the boundary page are all in the programmed state and the memory cells in the next page of the boundary page are all in the erased state, a verification result being pass; and if the memory cells in the previous page of the boundary page are not all in the programmed state or the memory cells in the next page of the boundary page are not all in the erased state, the verification result being fail; and a memory controller coupled with and controlling the memory device.

10. The memory system of claim 9, wherein the at least one memory device comprises a 3D NAND memory.

11. The memory system of claim 9, wherein the memory system comprises one of SSD, UFS, and SD card.

12. A method of operating of a memory device, comprising:

receiving a first information indicating to search a boundary page of a selected memory block in a plurality of memory blocks of the memory device, the boundary page being related to a page requiring information recovery in the selected memory block;

receiving an address of the selected memory block;

obtaining an address of the boundary page in connection with a page erasing check function using the address of the selected memory block, the page erasing check function being configured to feed back whether memory cells in the page to be checked are all in an erased state; and verifying the boundary page after obtaining the address of the boundary page, wherein verifying the boundary page comprises:

when the boundary page is a page other than a first page and a last page in the selected memory block, determining whether memory cells in a previous page of the boundary page are all in a programmed state and whether memory cells in a next page of the boundary page are all in the erased state;

if the memory cells in the previous page of the boundary page are all in the programmed state and the memory cells in the next page of the boundary page are all in the erased state, a verification result being pass; and if the memory cells in the previous page of the boundary page are not all in the programmed state or the memory cells in the next page of the boundary page are not all in the erased state, the verification result being fail.

13. The method of claim 12, wherein obtaining the address of the boundary page in connection with the page erasing check function using the address of the selected memory block comprises:

setting a value of a cyclic count to an initial value when receiving the first information;

setting an address of the first page to be checked and an address of the last page to be checked using an address of the selected memory block;

determining an address of a current page to be checked based on the address of the first page to be checked and the address of the last page to be checked;

determining a first result of the current page to be checked with the page erasing check function;

updating the address of the first page to be checked or the address of the last page to be checked according to the first result and then updating the value of the cyclic count;

comparing the updated value of the cyclic count with a preset value to obtain a second result, the preset value being related to a total number of pages contained in the selected memory block; and determining the address of the boundary page according to the second result.

14. The method of claim 13, wherein updating the address of the first page to be checked or the address of the last page to be checked according to the first result comprises:

updating the address of the last page to be checked to the address of the current page to be checked when the first result indicates that memory cells in the current page to be checked are all in the erased state; and updating the address of the first page to be checked to the address of the current page to be checked when the first result indicates that the memory cells in the current page to be checked are not all in the erased state.

15. The method of claim 14, wherein determining the address of the boundary page according to the second result comprises:

when the second result indicates the updated value of the cyclic count is greater than or equal to the preset value, determining an address of a current last page to be checked or an address of a current first page to be checked as the address of the boundary page; and when the second result indicates that the updated value of the cyclic count is smaller than the preset value, executing the updating of the value of the cyclic count, and then comparing the updated value of the cyclic count with the preset value and determining whether to continue executing a new updating of the value of the cyclic count according to a result of the comparison, until a recent value of the cyclic count is greater than or equal to the preset value, wherein the updating the value of the cyclic count comprises:

re-determining a new address of the current page to be checked according to an updated address of the first page to be checked and an updated address of the last page to be checked; and continuing to update the updated address of the first page to be checked or the updated address of the last page to be checked according to the first result of a new address of the current page to be checked and continuing to update the value of the cyclic count subsequently.

16. The method of claim 15, wherein determining the address of the boundary page according to the second result comprises:

when the second result indicates the updated value of the cyclic count is greater than or equal to the preset value, verifying states of memory cells in the current first page to be checked and the current last page to be checked;

if memory cells in pages in one of the current first page to be checked and the current last page to be checked are in the programmed state and memory cells in remaining pages are in the erased state, or memory cells in the current first page to be checked and the current last page to be checked are all in the programmed state, using the address of the current last page to be checked as the address of the boundary page; and if memory cells in the current first page to be checked and the current last page to be checked are all in the erased state, using the address of the current first page to be checked as the address of the boundary page.

17. The method of claim 13, wherein determining the address of the current page to be checked based on the address of the first page to be checked and the address of the last page to be checked comprises determining the address of the current page to be checked based on the address of the first page to be checked and the address of the last page to be checked in connection with a bisection method, wherein the total number of the pages contained in the selected memory block is n, the initial value of the cyclic count is 0, the preset value is an integer part of $\log_2 n + 1$, and n is a positive integer greater than 1.

18. The method of claim 12, wherein verifying the boundary page further comprises:

when the boundary page is the first page in the selected memory block, determining whether memory cells in the next page of the boundary page are all in the erased state, wherein determining whether the memory cells in the next page of the boundary page are all in the erased state comprises:

if the memory cells in the next page of the boundary page are all in the erased state, the verification result being pass; and if the memory cells in the next page of the boundary page are not all in the erased state, the verification result being fail; and when the boundary page is the last page in the selected memory block, determining whether memory cells in the previous page of the boundary page are all in the programmed state, wherein determining whether the memory cells in the previous page of the boundary page are all in the programmed state comprises:

if the memory cells in the previous page of the boundary page are all in the programmed state, the verification result being pass; and if the memory cells in the previous page of the boundary page are not all in the programmed state, the verification result being fail.

19. The method of claim 12, wherein the memory device comprises a 3D NAND memory.

20. The method of claim 12, wherein a memory system including the memory device comprises one of SSD, UFS, and SD card.

* * * * *